United States Patent
Anholt

(10) Patent No.: US 9,281,844 B2
(45) Date of Patent: Mar. 8, 2016

(54) CONFIGURABLE AND LOW POWER ENCODER FOR CYCLIC ERROR CORRECTION CODES

(71) Applicant: Apple Inc., Cupertino, CA (US)

(72) Inventor: Micha Anholt, Tel Aviv (IL)

(73) Assignee: Apple Inc., Cupertino, CA (US)

(*) Notice: Subject to any disclaimer, the term of this patent is extended or adjusted under 35 U.S.C. 154(b) by 108 days.

(21) Appl. No.: 13/865,345

(22) Filed: Apr. 18, 2013

(65) Prior Publication Data

US 2014/0317478 A1    Oct. 23, 2014

(51) Int. Cl.
*H03M 13/05* (2006.01)
*H03M 13/15* (2006.01)
*H03M 13/25* (2006.01)
*G06F 11/10* (2006.01)
*H03M 13/00* (2006.01)

(52) U.S. Cl.
CPC .......... *H03M 13/15* (2013.01); *H03M 13/1595* (2013.01); *H03M 13/6516* (2013.01); *H03M 13/6561* (2013.01); *H03M 13/152* (2013.01); *H03M 13/1515* (2013.01)

(58) Field of Classification Search
CPC ............... G11B 2020/1836; G11B 2020/1843; G11B 20/1833; H03M 13/05; H03M 13/15; H03M 13/1515; H03M 13/152; H03M 13/159; H03M 13/1595; H03M 13/4107; H03M 13/6516; H03M 13/6561; H03M 13/25; H04L 1/0057; H04L 1/24

USPC .......... 714/781, E11.032, 752, 784, 801, 800, 714/799

See application file for complete search history.

(56) References Cited

U.S. PATENT DOCUMENTS 4,295,218 A    10/1981  Tanner
5,535,225 A    7/1996  Mayhew et al.
(Continued)

OTHER PUBLICATIONS

"Designing Fault-Secure Parallel Encoders forSystematic Linear Error Correcting Code" Stanislaw J. Piestrak, Abbas Dandache, and Fabrice Monteiro, pp. 1-9.

(Continued)

*Primary Examiner* — Phung M Chung
(74) *Attorney, Agent, or Firm* — Meyertons, Hood, Kivlin, Kowert & Goetzel, P.C.

(57) ABSTRACT

A method for encoding includes receiving input data symbols to be encoded with an Error Correction Code (ECC) so as to produce a code word of the ECC including redundancy symbols. The input data symbols are applied first and second processing stages, such that the first processing stage performs a first polynomial division by a fixed-coefficient polynomial with a first degree of parallelism, and the second processing stage performs a second polynomial division by a configurable-coefficient polynomial with a second degree of parallelism that is smaller than the first degree of parallelism, so as to jointly produce the redundancy symbols.

8 Claims, 3 Drawing Sheets

(56) References Cited

U.S. PATENT DOCUMENTS

| | | | | |
|---|---|---|---|---|
| 6,405,339 | B1* | 6/2002 | Cox et al. | 714/756 |
| 7,225,391 | B1 | 5/2007 | Bain | |
| 8,108,759 | B2* | 1/2012 | Moon et al. | 714/781 |
| 8,180,820 | B1 | 5/2012 | Graham | |
| 8,261,176 | B2 | 9/2012 | Alrod et al. | |
| 8,312,345 | B1* | 11/2012 | Feng | 714/755 |
| 8,484,541 | B1* | 7/2013 | Anholt | 714/781 |
| 8,595,602 | B2* | 11/2013 | Anholt | 714/781 |
| 8,719,678 | B2* | 5/2014 | Anholt | 714/781 |
| 2008/0148129 | A1* | 6/2008 | Moon et al. | 714/758 |
| 2010/0031126 | A1 | 2/2010 | Andreev et al. | |
| 2010/0042907 | A1* | 2/2010 | Pilsl | 714/782 |

OTHER PUBLICATIONS

Jens Spinner, Juergen Freudenberger "Semi-automatic Source Code Generation for the Hardware-Implementation of a Parallelizable and Configurable Error Correction Unit" 2012 8th Conference on Ph.D. Research in Microelectronics and Electronics (PRIME), pp. 12-15 Jun. 2012.

"High-speed architectures for parallel long BCH encoders", GLSVLSI '04 Proceedings of the 14th ACM Great Lakes symposium on VLSI, pp. 1-6.

* cited by examiner

CONFIGURABLE AND LOW POWER ENCODER FOR CYCLIC ERROR CORRECTION CODES

FIELD OF THE INVENTION

The present invention relates generally to error correction coding, and particularly to methods and systems for data encoding with cyclic error correction codes.

BACKGROUND OF THE INVENTION

Error Correction Codes (ECC) are used in a variety of applications, such as in various digital communication and data storage applications. Some ECC types, referred to as cyclic codes, can be represented by generator polynomials defined over a Galois field. Commonly-used examples of cyclic codes are Bose-Chaudhuri-Hocquenghem (BCH) codes and Reed-Solomon (RS) codes. Encoders of cyclic codes are often based on polynomial division. Several example encoder configurations are described by Lin and Costello in "Error Control Coding," Prentice Hall, second edition, June, 2004, chapter 5, pages 146-149, and by Blahut in "Algebraic Codes for Data Transmission," Cambridge University Press, 2004, chapter 8, pages 228-237, which are incorporated herein by reference.

In some applications of error correction coding, it is desirable that the encoder be configurable, i.e., be able to encode data with one of multiple different codes. Several types of configurable ECC encoders are described in the patent literature. For example, U.S. Pat. No. 7,478,310, whose disclosure is incorporated herein by reference, describes a programmable error correcting device. The device includes a controller, which receives information about a length of a codeword, an error correcting capacity, whether or not a shortened codeword mode is supported and a total byte number of burst data, and outputs a control signal. A preprocessor divides input information data by a length of information byte in a codeword and outputs the divided input information data in response to the control signal. A coder decides on a structure for encoding according to the control signal, and performs error correcting encoding on information data provided by the preprocessor according to the decided structure.

U.S. Pat. No. 6,385,751, whose disclosure is incorporated herein by reference, describes a programmable, reconfigurable Reed-Solomon encoder/decoder. The Galois Field order, the primitive polynomial and the number of symbols for each codeword are settable via writable registers. The decoder and encoder parameters are separately specified and the decoder and encoder can run simultaneously and independently.

U.S. Patent Application Publication 2009/0077449, whose disclosure is incorporated herein by reference, describes an encoder and a syndrome computer for cyclic codes, which process M codeword symbols per cycle where M is greater than or equal to one. The encoder and syndrome computer optionally further provide the configurability of a different M value for each cycle and/or the configurability of a different cyclic code for each codeword.

U.S. Pat. No. 6,353,909, whose disclosure is incorporated herein by reference, describes a configurable Reed-Solomon encoder. The encoder comprises a multiplexed multiplier-accumulator, a parallel latch bank operatively coupled to the multiplexed multiplier-accumulator, a data/parity multiplexer coupled to the parallel latch bank, and an encoder controller operatively coupled to, and controlling the operation of, the multiplexed multiplier-accumulator, the parallel latch bank, and the data/parity multiplexer.

U.S. Pat. No. 6,631,488, whose disclosure is incorporated herein by reference, describes a configurable error detection and correction engine having a specialized instruction set tailored for error detection and correction tasks. The engine has a plurality of functional building blocks (e.g., a configurable convolutional encoding functional block, a convolutional configurable decoding functional block, and a configurable cyclic redundancy check (CRC) functional block) that can be programmed or configured.

U.S. Pat. No. 8,180,820, whose disclosure is incorporated herein by reference, describes generating a remainder from a division of a first polynomial by a second polynomial having a variable width. One or more embodiments include a first sub-circuit, a first adder, a second sub-circuit, and a second adder. The first sub-circuit is adapted to generate a first partial remainder, which has a fixed width greater than or equal to the width of the second polynomial, from the first polynomial excepting a least significant portion. The first adder is adapted to generate a sum of the least significant portion of the first polynomial and a most significant portion of the first partial remainder. The second sub-circuit is adapted to generate a second partial remainder from the sum. The second adder is adapted to generate the remainder from the second partial remainder and the first partial remainder excepting the most significant portion.

SUMMARY OF THE INVENTION

An embodiment of the present invention provides a method for encoding, including receiving input data symbols to be encoded with an Error Correction Code (ECC) so as to produce a code word of the ECC comprising redundancy symbols. First and second processing stages are applied to the input data such that the first processing stage performs a first polynomial division by a fixed-coefficient polynomial with a first degree of parallelism, and the second processing stage performs a second polynomial division by a configurable-coefficient polynomial with a second degree of parallelism that is smaller than the first degree of parallelism, so as to jointly produce the redundancy symbols.

In some embodiments, applying the first and second processing stages includes partitioning the input data symbols into first and second subsets, applying the first processing stage to the first subset, so as to produce a first parity, splitting the first parity into first and second parts, applying the second processing stage to a sum of the second subset of the input data symbols and the first part of the first parity, so as to produce a second parity and producing the redundancy symbols by summing the second parity and the second part of the first parity.

In other embodiments, the ECC is defined by a generator polynomial, the second processing stage performs the second polynomial division by the generator polynomial of the ECC, and the first processing stage performs the first polynomial division by a multiple of the generator polynomial.

In yet other embodiments, the ECC is selected from among multiple ECCs defined by respective generator polynomials, the first processing stage performs the first polynomial division by a maximal-rank polynomial that is a multiple of each of the multiple generator polynomials, and applying the second processing stage includes configuring the second processing stage with the generator polynomial of the selected ECC.

In some embodiments, the ECC is selected from among multiple ECCs, and the method further includes re-selecting the ECC and re-configuring the second processing stage with the generator polynomial of the re-selected ECC.

In other embodiments, the method further includes transmitting the code word of the ECC over a communication channel to a receiver. In yet other embodiments, the method further includes storing the code word of the ECC in a memory device.

There is also provided, in accordance with an embodiment that is described herein, an apparatus for encoding, including first and second processing stages and ancillary logic. The first processing stage is configured to perform a first polynomial division by a fixed-coefficient polynomial with a first degree of parallelism. The second processing stage is configured to perform a second polynomial division by a configurable-coefficient polynomial with a second degree of parallelism that is smaller than the first degree of parallelism. The ancillary logic is configured to receive input data symbols that are to be encoded with an Error Correction Code (ECC) so as to produce a code word of the ECC comprising redundancy symbols, and to apply the first and second processing stages to the input data symbols so as to jointly produce the redundancy symbols.

The present invention will be more fully understood from the following detailed description of the embodiments thereof, taken together with the drawings in which:

DETAILED DESCRIPTION OF EMBODIMENTS

Overview

Figure 1:
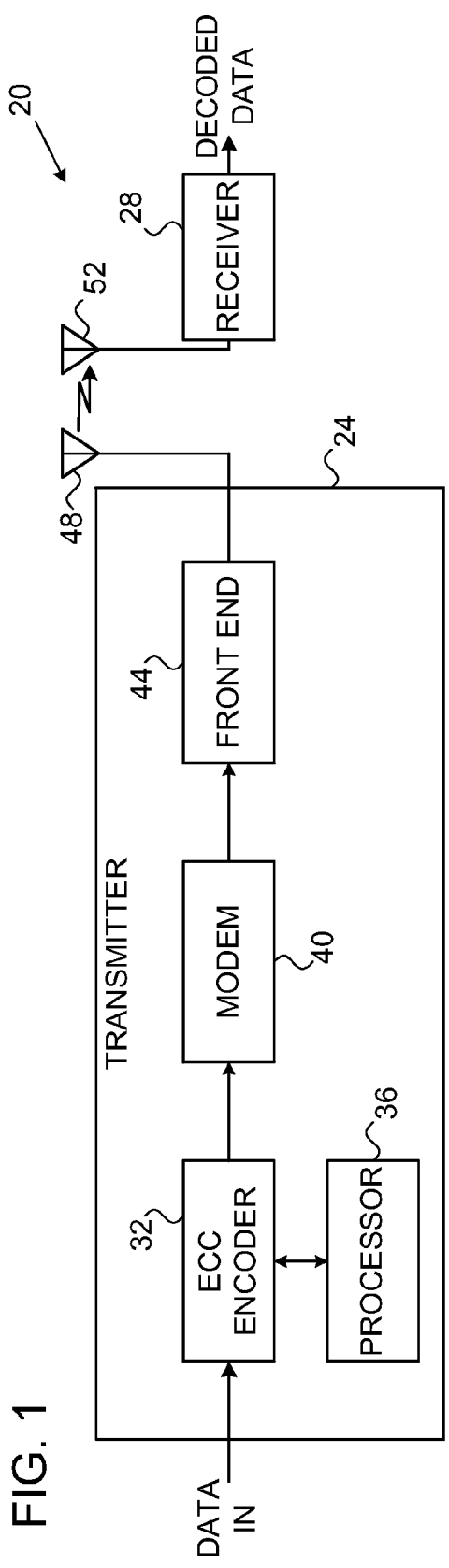
FIG. 1 is a block diagram that schematically illustrates a communication system that uses Error Correction Coding (ECC), in accordance with an embodiment of the present invention.

In some Error Correction Coding (ECC) applications, data is encoded with one of multiple different codes. In storage applications, for example, a memory controller may be designed to operate with different types of memory devices having different page sizes, and should therefore support multiple code word sizes. In communication applications, different codes may be used to match varying channel conditions. In both communication and storage applications, it is sometimes desirable to encode different types of data, such as management data and user data, with different codes. Additionally, it is desirable to implement the ECC with minimal area and power consumption.

Embodiments of the present invention that are described herein provide improved methods and systems for encoding input data with one of multiple cyclic ECCs. Typically, an ECC encoder accepts a sequence of input data symbols and generates a sequence of parity or remainder symbols. The input data symbols and the parity symbols are then combined to produce a code word.

In some embodiments, the ECC encoding operation may be viewed as a polynomial division operation. Each of the multiple ECC codes is defined by a respective generator polynomial, and the sequence of input data symbols is represented by a corresponding data polynomial whose coefficients represent the data symbols. To encode the input data symbols, the encoder selects one of the multiple codes and divides the data polynomial by the generator polynomial of the selected code. The division operation generates a remainder or parity polynomial whose coefficients represent the parity symbols. The parity polynomial is also referred to as a redundancy polynomial.

In an embodiment, the encoder generates the parity polynomial using two distinct stages, each comprising a different divisor polynomial. For the first stage, a maximal degree divisor polynomial (referred to as a maximal polynomial) is selected beforehand. The maximal polynomial divides each of the multiple generator polynomials without remainder. The maximal polynomial comprises fixed coefficients, and therefore the first stage may be efficiently implemented with a highly parallel circuit or logic, i.e., by processing a large number of input symbols in each clock cycle, thus improving the encoding speed or throughput.

The divisor polynomial in the second stage is configured to divide by a generator polynomial of the selected code. The coefficients of the divisor polynomial in the second stage are configurable, and it is typically implemented by a circuit or logic with lower parallelism relative to the first stage. The final encoding parity is derived from the parities generated by the two division stages, as will be explained in detail below. Ancillary logic controls the various I/O and internal operations of the encoder.

The two encoding stages typically accept inputs of different lengths. The input length to the second stage is equal to the difference between the degree of the maximal polynomial and the degree of generator polynomial of the selected code. The input length to the first stage is equal to the difference between the input data length and the length of the second stage input. In many practical cases the input to the first stage is much longer than the input to the second stage.

The disclosed encoder schemes thus operate in two stages. The circuit of the first stage is typically fixed, accepts long inputs, and processes multiple symbols per clock cycle (i.e., highly parallel). The circuit of the second stage is configurable, accepts much shorter inputs, and typically processes fewer symbols per clock cycle relative to the first stage. As a result, the overall encoder throughput is improved, and its size, cost, and power consumption are reduced.

System Description

Figure 2:
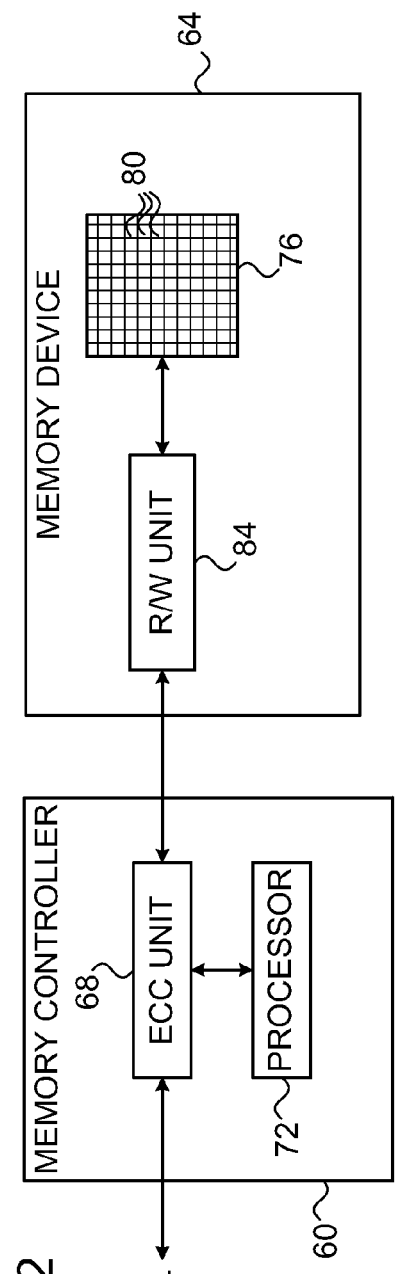
FIG. 2 is a block diagram that schematically illustrates a memory system that uses ECC, in accordance with an embodiment of the present invention.

Embodiments of the present invention provide improved methods and systems for encoding data with cyclic Error Correction Codes (ECC), such as Bose-Chaudhuri-Hocquenghem (BCH) or Reed-Solomon (RS) codes. The disclosed techniques can be used in a wide variety of systems and applications in which ECC is deployed, such as in various communication and data storage systems. FIGS. 1 and 2 below illustrate two example applications.

FIG. 1 is a block diagram that schematically illustrates a wireless communication system 20 that uses error correction coding, in accordance with an embodiment of the present invention. System 20 comprises a transmitter 24, which transmits data to a receiver 28. The transmitter comprises an ECC encoder 32, which accepts input data and encodes the data with a certain ECC. ECC encoder 32 is configurable to support multiple different codes, using techniques that are explained in detail below. ECC encoder 32 is controlled by a processor 36. In particular, processor 36 typically instructs the encoder which code to use when encoding given data for transmission.

The transmitter comprises a modem 40, which modulates the encoded data in accordance with a certain modulation scheme. A front end 44 converts the modulated digital signal to an analog signal, up-converts the analog signal to a suitable Radio frequency (RF), and transmits the RF signal toward receiver 28 using a transmit antenna 48. In receiver 28, a receive antenna 52 receives the RF signal. The receiver typically down-converts and digitizes the RF signal. The receiver demodulates the signal carrying the ECC-encoded data, and decodes the ECC so as to reconstruct the transmitted data. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

FIG. 2 is a block diagram that schematically illustrates a data storage system 56 that employs error correction coding, in accordance with an alternative embodiment of the present invention. System 56 comprises a memory controller 60, which stores data in a memory device 64. The memory device comprises an array 76 comprising multiple memory cells 80. Array 76 may comprise any suitable type of volatile or non-volatile memory, such as, for example, Random Access Memory (RAM) or Flash memory. Alternatively, device 64 may comprise a magnetic storage device such as a Hard Disk Drive (HDD), or any other suitable storage medium. System 56 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

Memory device 64 comprises a Read/Write (R/W) unit 84, which writes data values into memory cells 80 and reads data values from the memory cells. Memory controller 60 comprises an ECC unit 68, which encodes the data for storage with a certain ECC, and decodes the ECC of data that is retrieved from the memory cells. ECC unit 68 is configurable to support multiple different codes, using techniques that are explained in detail below. The ECC unit is controlled by a processor 72. In particular, processor 72 typically instructs the ECC unit which code to use when encoding given data for storage.

The ECC used in systems 20 and 56 may comprise, for example, a suitable BCH or RS code, as well as various other types of cyclic ECC. Processors 36 and 72, ECC encoder 32 and ECC unit 68 can be implemented in software, in hardware or using a combination of hardware and software elements. In some embodiments, processors 36 and 72 comprise general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory.

The ECC encoder configurations described hereinbelow can be used in communication systems such as system 20, as well as in data storage systems such as system 56. The description that follows applies to both communication applications and to storage applications, and refers generally to an ECC encoder and a processor. Any reference to the ECC encoder applies to encoder 32 of system 20, as well as to the encoder functionality of unit 68 in system 56. Any reference to the processor applies to processor 36 of system 20, as well as to processor 72 in system 56. Alternatively, the methods described herein can be carried out by any suitable element in any suitable system that involves ECC encoding.

Configurable Encoder Schemes

A typical ECC encoder accepts K data symbols for encoding and produces an N-symbol code word, N>K. The description that follows refers mainly to binary codes, in which the encoder accepts K input data bits and produces an N-bit code word. Nevertheless, the disclosed techniques can be used with non-binary codes, as well, for which the term symbol generalizes the term bit. The description that follows refers to systematic codes. In a systematic code, the code word includes the original K data bits, plus N−K redundancy (parity) bits. The rank or degree of a polynomial is defined to be equal to its highest exponent. Thus, a set of n bits denoted $[b_0 \ldots b_{n-1}]$ may be represented by a polynomial of n terms $b_0 \cdot x_0 + b_1 \cdot x_1 + \ldots + b_{n-1} \cdot x^{n-1}$ whose rank is at most n−1. When dividing by a polynomial of rank n, the rank of the remainder polynomial is at most n−1, i.e., the remainder comprises n bits.

Cyclic codes and their encoding and decoding can be represented using polynomial operations over a finite field, typically a Galois Field (GF). A given cyclic code can be represented by a generator polynomial whose rank is N−K, i.e., the redundancy size. Code words can be represented as polynomials whose rank is N, in which the data bits correspond to the polynomial coefficients. All code words are represented by polynomials that are multiples of the generator polynomial of the code. In a systematic cyclic code, each code word can be expressed as a sum of a systematic polynomial (a polynomial of rank N−1, i.e., N coefficients, in which the lower N−K coefficients are zero and the higher K coefficients comprise the data bits), plus a redundancy polynomial of rank N−K−1, whose N−K coefficients comprise the redundancy bits.

In other words, the redundancy polynomial can be produced by dividing the systematic polynomial by the generator polynomial of the code. Thus, encoding data with a systematic cyclic code can be performed by (1) dividing the polynomial representing the input data by the generator polynomial, (2) taking the remainder of the division operation to produce the redundancy bits (or a negation of the redundancy in some non-binary codes), and (3) constructing a code word comprising the data bits and the redundancy bits. Various hardware configurations for performing such polynomial division and remainder operations are known in the art. Several configurations are described, for example, in the references by Blahut and Lin and Costello, cited above.

In the embodiments described below the parity bits are generated by polynomial division in two stages. The divisor of the first stage is a fixed polynomial, denoted PMAX(x) having a fixed rank denoted RMAX. The divisor of the second stage is a configurable polynomial g(x) whose rank R is lower than RMAX. The polynomials are selected such that PMAX (x) is a multiple of g(x). In other words, for an encoder that supports multiple codes, wherein $g_i(x)$ is the generator polynomial of the $i^{th}$ code, the relationship PMAX(x)=$g_i(x) \cdot q_i(x)$ holds for some quotient $q_i(x)$ (and zero remainder) for all the codes.

In some applications, the encoder employs parallel circuitry to perform the division, i.e., the encoder processes multiple input bits in a single clock cycle. In the description below and in the claims, the parallelism degree is defined by the number of input bits that are processed in one clock. The more bits processed, the higher is the parallelism degree. In general, when the coefficients of the divisor polynomial are fixed it is easier to achieve higher parallelism, since fixed-coefficient circuitry is typically simpler and smaller and consumes less power.

Certain aspects of two-stage ECC encoding are also addressed in U.S. patent application Ser. No. 12/616,151, filed Nov. 11, 2009, which is assigned to the assignee of the present patent application and whose disclosure is incorporated herein by reference.

A Two-Stage Configurable Encoder Scheme

Figure 3A:
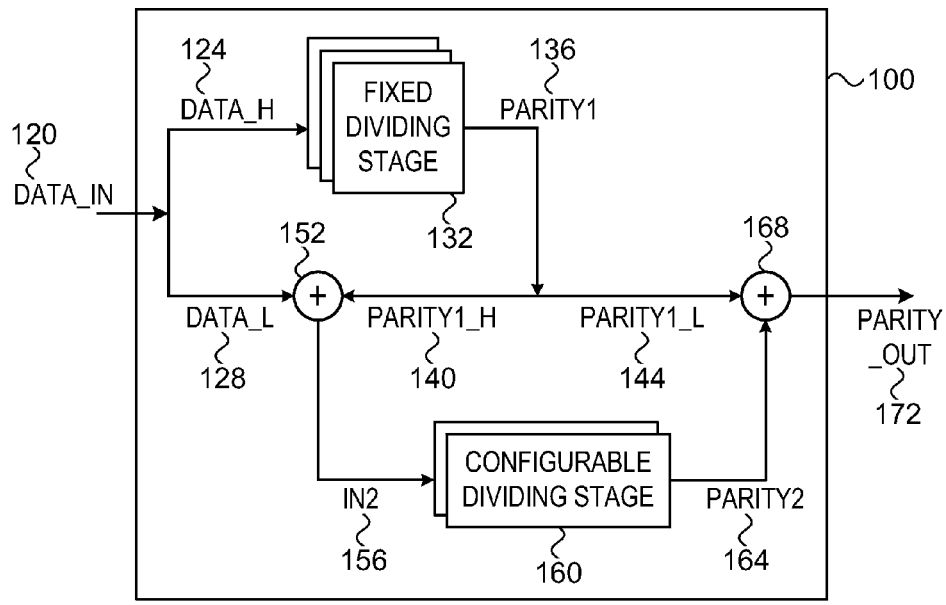
FIG. 3A is a block diagram that schematically illustrates a two-stage encoder, in accordance with an embodiment of the present invention.
Figure 3B:
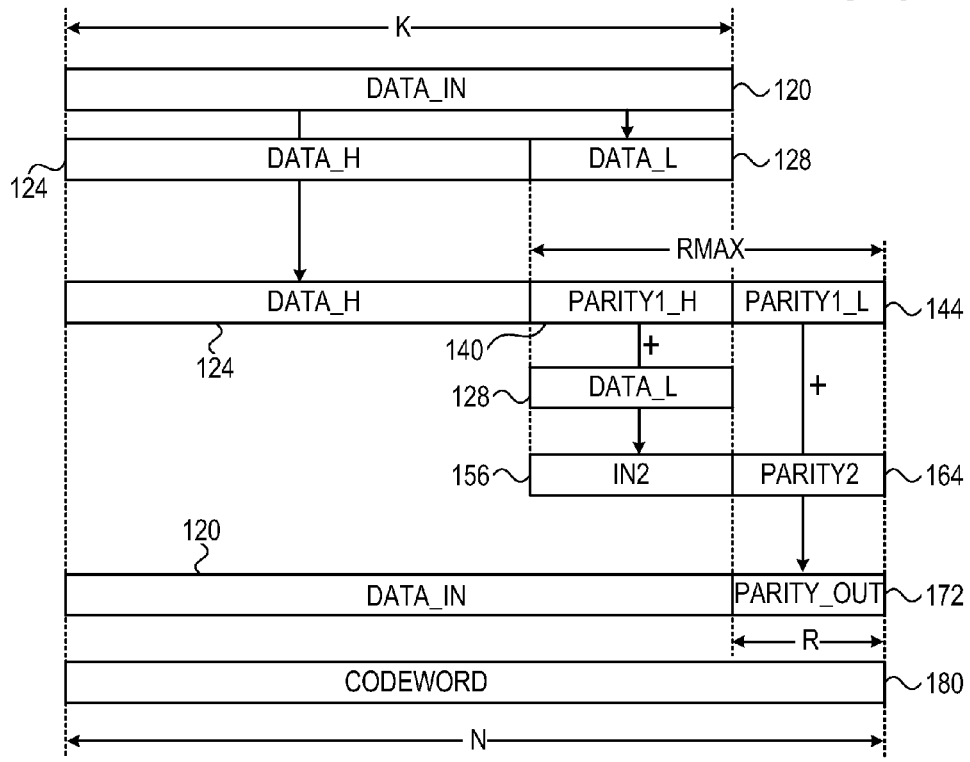
FIG. 3B is a diagram that schematically illustrates a two-stage encoding process, in accordance with an embodiment of the present invention.

FIGS. 3A and 3B are a block diagram and an auxiliary diagram that schematically illustrate a two-stage encoder 100, in accordance with an embodiment of the present invention. Auxiliary FIG. 3B depicts multiple data units with corresponding sizes and relationships to clarify the description of FIG. 3A. Encoder 100 in FIG. 3A supports multiple cyclic codes, in the present example BCH codes, and may represent for example, either ECC 32 in FIG. 1 or ECC 68 in FIG. 2. Processor 36 or 72 configures encoder 100 to one of the supported codes.

In FIGS. 3A and 3B, input data denoted DATA_IN 120 comprises K bits, which are to be encoded to produce R parity bits for an N-bit code word (N=K+R). To process the input data, the encoder first splits the K input bits into a high part DATA_H 124 having N−RMAX bits, and a low part DATA_L 128 having RMAX−R bits. In an example storage application the code word length N is typically on the order of 8,000-40,000 bits, of which the redundancy (R, RMAX) occupies 5%-10% of the bits. Alternatively, any other suitable values can be used.

The DATA_H part enters a first dividing stage 132. Dividing stage 132 comprises a fixed divisor module that divides the polynomial represented by DATA_H by the polynomial PMAX(x). The first stage's division results in some quotient (not shown) and RMAX parity bits denoted PARITY1 136. The encoder splits PARITY1 into a high part denoted PARITY1_H 140 having RMAX−R bits, and a low part denoted PARITY1_L 144 having R bits.

Since PMAX(x) is a multiple of a generator polynomial of rank R, dividing DATA_H by the configurable polynomial g(x) would essentially give the same PARITY1_L bits, however with less parallelism. On the other hand, dividing DATA_L 128 and PARITY1_H 140 by g(x) may still generate non-zero parity, and they are therefore input to a second dividing stage as described below. The encoder calculates the sum of DATA_L and PARITY1_H using a XOR module 152 to generate IN2 156 bits. IN2 having RMAX−R bits serve as the input bits to a second dividing stage 160. Stage 160 has a lower degree of parallelism relative to stage 132.

The divisor of stage 160 is configured, for example by processor 36 or 72, to the generator polynomial (of rank R) of the desired ECC code. Dividing stage 160 generates an R-bit remainder, denoted PARITY2 164. XOR 160 sums PARITY1_L 144 and PARITY2 164 to generate the final R-bit parity denoted PARITY_OUT 172. The encoder then concatenates PARITY_OUT to DATA_IN to produce a code word 180 (CODEWORD). It would be appreciated that since DATA_H 124 is much longer than IN2 156, the lower parallelism degree of dividing stage 160 does not significantly reduce the speed gain achieved due to the higher parallelism degree of stage 132.

The various I/O and control operations in encoder 100 are performed by internal ancillary logic. For example, the ancillary logic accepts input data symbols and outputs the final code word. Additionally, the ancillary logic is responsible to internal tasks such as coefficient configuration, data splitting/routing/summing, and timely operation of the dividing stages.

Encoder 100 comprises two dividing stages 132 and 160 as described above. Each of the dividing stages can have any suitable degree of parallelism. For example, stage 132 can process thirty-two symbols per clock cycle and stage 160 can process a lower number of symbols such as eight symbols per cycle. Alternatively, any other suitable values can be used. Stage 160 can even be non-parallel and process one symbol per clock cycle.

Encoder 100 can switch from one cyclic code to another in real time during the operation of system 20. Transmitter 24 or memory controller 60 may perform code switching on the fly, by re-configuring the encoder to a different desired code. Note however, that code switching re-configures only the divisor polynomial coefficients of stage 160, whereas the divisor coefficients of stage 132 are fixed and remain unchanged. Following code switching, the encoder starts encoding the input data and generating respective parity symbols using the most-recently selected code.

Encoder 100 can be used in any cyclic encoding method that generates redundancy symbols by polynomial division. Example codes include BCH codes, Reed-Solomon codes, and CRC codes.

The method of FIG. 3 describes polynomial division by two processing stages (fixed and configurable). The method however, can be extended to any suitable number of stages, some of which are fixed and some are configurable. The processing stages can be applied in any suitable order.

Figure 4:
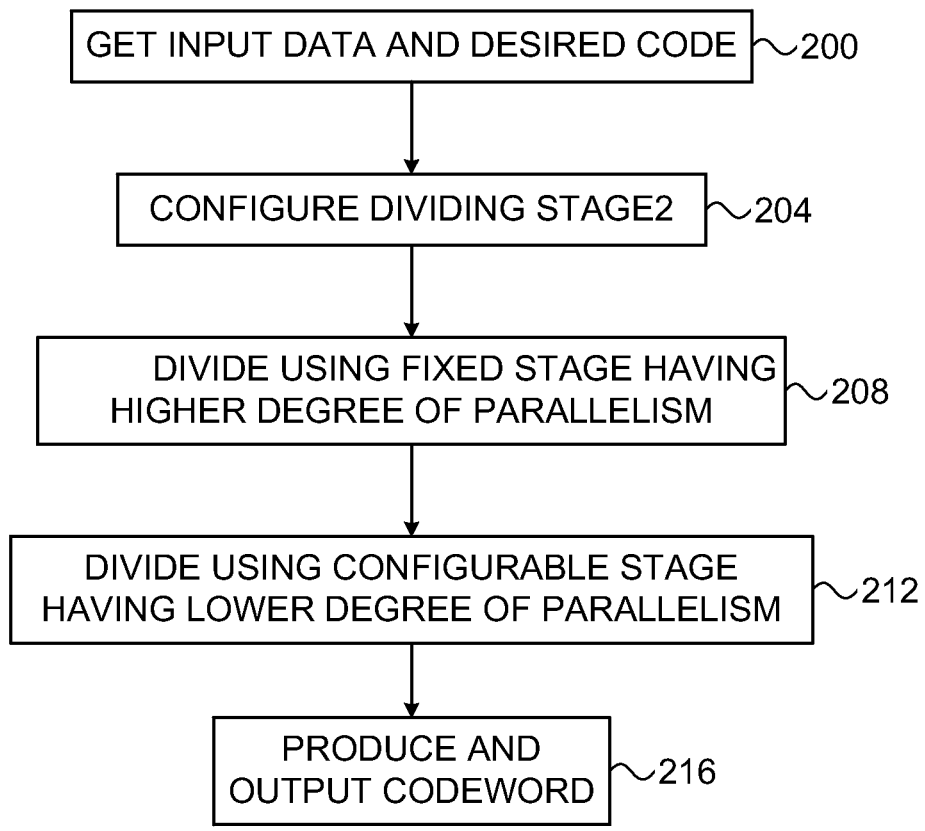
FIG. 4 is a flow chart that schematically illustrates a method for a two-stage cyclic encoding, in accordance with an embodiment of the present invention.

FIG. 4 is a flow chart that schematically illustrates a method for two-stage cyclic encoding, in accordance with an embodiment of the present invention. The method begins with encoder 100 receiving input data and a desired code indicator, at an input step 200. The desired code may be selected for example by processor 36 or 72 based on the noise level of the communication channel or on the reliability level required for the memory device. The encoder configures dividing stage 160 to a respective generator polynomial based on the code indicator, at a configuration step 204.

The encoder generates PARITY1 136 bits using dividing stage 132 at a first division step 208. The dividing stage at step 208 is highly parallel, i.e., stage 132 processes multiple input bits in each clock cycle. The encoder calculates bits IN2 156 as described above in FIGS. 3A and 3B. The encoder then generates PARITY2 164 bits using dividing stage 160, at a second division step 212.

Since stage 160 at step 212 comprises configurable coefficients, it has lower parallelism relative to stage 132 (or even no parallelism). The method terminates at a termination step 216 where the encoder calculates PARITY_OUT 172 bits and produces a code word 180 (CODEWORD) as described in FIGS. 3A and 3B above. Further at step 216, the encoder outputs CODEWORD 180 to modem 40 or to memory device 64.

The configuration of encoder 100 in FIGS. 3 and 4 is an example configuration, which is chosen purely for the sake of conceptual clarity. In alternative embodiments, any other suitable configuration can also be used. The different elements of encoder 100 may be implemented using any suitable hardware, such as in an Application-Specific Integrated Circuit (ASIC) or Field-Programmable Gate Array (FPGA). In some embodiments, some elements of the encoder can be implemented using software, or using a combination of hardware and software elements. For example, in the present disclosure, the fixed stage 132 and the configurable stage 160 can be implemented in separated ASIC or FPGA modules. Moreover, the ancillary logic that controls the internal operations within encoder 100 can be implemented in hardware or in software.

Although the embodiments described herein mainly address storage applications, the methods and systems described herein can also be used in other applications that involve polynomial division, such as in hash computations or encryption/decryption computations.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    receiving an input data symbol by an encoder unit,
    dividing, by the encoder unit, the input data symbol into a first part and a second part;
    dividing, by a first divider circuit, the first part of the input data symbol by a fixed-coefficient polynomial to generate a quotient, wherein the fixed-coefficient polynomial is a multiple of a generator polynomial;
    separating, by the encoder unit, the quotient into a third part and a fourth part, wherein the third part includes a first subset of data bits of the quotient and the fourth part includes a second subset of the data bits of the quotient, wherein the second subset is different than the first subset;
    summing, by the encoder unit, the second part of the input data symbol and the third part of the quotient to generate an interim sum,
    dividing the interim sum by the generator polynomial by a second divider circuit to generate a remainder,
    summing, by the encoder unit, the remainder and the fourth part of the quotient to generate a parity code word; and
    concatenating the input data symbol and the parity code word to generate an encoded code word.

2. The method according to claim 1, further comprising receiving a code indicator, and configuring the second divider circuit dependent upon the code indicator.

3. The method according to claim 1, further comprising transmitting the encoded code word over a communication channel to a receiver.

4. The method according to claim 1, further comprising storing the encoded code word in a memory device.

5. An apparatus, comprising:
    a first circuit configured to receive input data and split the input data into a first part and a second part;
    a first divider circuit configured to divide the first part of the input data by a fixed-coefficient polynomial to generate a quotient, wherein the fixed-coefficient polynomial is a multiple of a generator polynomial;
    a second circuit coupled to the first divider circuit, wherein the second circuit is configured to split the quotient into a third part and a fourth part, wherein the third part includes a first subset of data bits included in the quotient, and the fourth part includes a second subset of the data bits included in the quotient, wherein the second subset is different than the first subset;
    a first adder circuit coupled to the first divider circuit, wherein the first adder circuit is configured to add the third part of the quotient with the second part of the input data to generate an interim sum;
    a second divider circuit coupled to the first adder circuit, wherein the second divider circuit is configured to divide the interim sum by the generator polynomial to generate a remainder;
    a second adder circuit coupled to the second divider circuit and the second circuit, wherein the second adder circuit is configured to add the remainder and the fourth part to generate a parity code word; and
    a third circuit coupled to the second adder circuit, wherein the third circuit is configured to concatenate the input data and the parity code word to generate an encoded code word.

6. The apparatus according to claim 5, wherein the first circuit is further configured to receive a code indicator and configure the second divider circuit dependent upon the code indicator.

7. The apparatus according to claim 5, further comprising a transmitter configured to transmit the encoded code word over a communication channel to a receiver.

8. The apparatus according to claim 5, wherein the circuitry is further configured to store the encoded code word in a memory device.

* * * * *